(12) United States Patent
Atkinson et al.

(10) Patent No.: US 6,645,684 B2
(45) Date of Patent: Nov. 11, 2003

(54) ERROR REDUCTION IN SEMICONDUCTOR PROCESSES

(75) Inventors: Chris D. Atkinson, Lewisville, TX (US); Keith W. Melcher, McKinney, TX (US); Richard L. Guldi, Dallas, TX (US)

(73) Assignee: Texas Instruments Incorporated, Dallas, TX (US)

( * ) Notice: Subject to any disclaimer, the term of this patent is extended or adjusted under 35 U.S.C. 154(b) by 0 days.

(21) Appl. No.: 09/972,497

(22) Filed: Oct. 5, 2001

(65) Prior Publication Data

US 2003/0068833 A1 Apr. 10, 2003

(51) Int. Cl.$^7$ .................................................. G03C 5/00
(52) U.S. Cl. ........................................................ 430/30
(58) Field of Search ................................ 356/487, 358; 438/14; 430/30

(56) References Cited

U.S. PATENT DOCUMENTS 5,338,630 A * 8/1994 Yoon ............................ 430/30
6,219,144 B1 * 4/2001 Hill ............................ 356/487

* cited by examiner

Primary Examiner—John F. Niebling
Assistant Examiner—André C Stevenson
(74) Attorney, Agent, or Firm—Michael K. Skrehot; Wade James Brady, III; Frederick J. Telecky, Jr.

(57) ABSTRACT

A photolithography system includes a photolithography tool 32 that includes a stage upon which a semiconductor wafer is mounted. The tool is operable to move the stage to automatically focus a pre-determined image on a surface of the semiconductor wafer. The tool is further operable to log movements of the stage. The system also includes an automation host computer 36 operable to poll the photolithography tool 32 to obtain data reflecting the logged movements of the stage. The automation host computer 36 is further operable to analyze the data and compare the data to pre-determined error conditions. The host computer also takes a pre-determined action, including sending an electronic mail message to the personal computers 38 of relevant line personnel, in the event the data meets the pre-determined error conditions.

15 Claims, 10 Drawing Sheets

ERROR REDUCTION IN SEMICONDUCTOR PROCESSES

CROSS-REFERENCE TO RELATED APPLICATIONS

Not applicable.

BACKGROUND OF THE INVENTION

This invention is in the field of semiconductor processing, and more particularly in the field of photolithography.

In semiconductor processing, photolithography is the process of defining particular features on the surface of a semiconductor wafer. The feature is typically defined with a patterned exposure into a photosensitive material that has been previously deposited on the wafer surface. In a typical photolithographic system, a master pattern image in the form of a photomask or reticle is replicated across the surface of the wafer. The image is typically projected onto the photosensitive material (e.g. photoresist) through a lens system. The quality of the image, and hence the quality and reliability of the resulting feature on the semiconductor surface, is directly related to mechanical parameters such as the spacing and orientation of the lens system relative to the chuck and stage upon which the wafer is placed.

Lithography equipment typically includes a mechanism for fixing the wafer onto a chuck that rests on a movable stage. If the chucking is not done correctly, or if contamination exists on the chuck or the wafer backside, the wafer will not lie flat on the surface of the chuck. This often results in resolution failures as the system has difficulty focusing the image in the area of the topographical feature caused by the chucking error. The local tilt of the wafer surface in the area of the undesired topographical feature can cause misformation of the projected image. The imaging errors can result in the scrapping of one or more die of the wafer, or indeed one or more die of multiple wafers or multiple lots of wafers if a repeatable and persistent error goes undetected.

Figure 1:
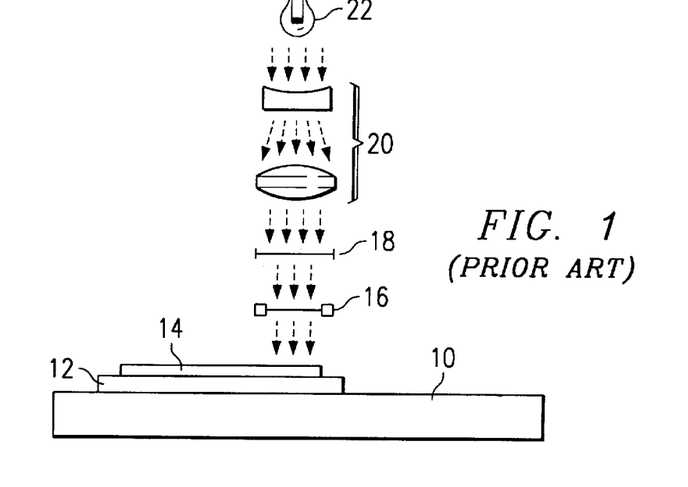
FIG. 1 is a side view diagram of a prior art photolithography tool.
Figure 2:
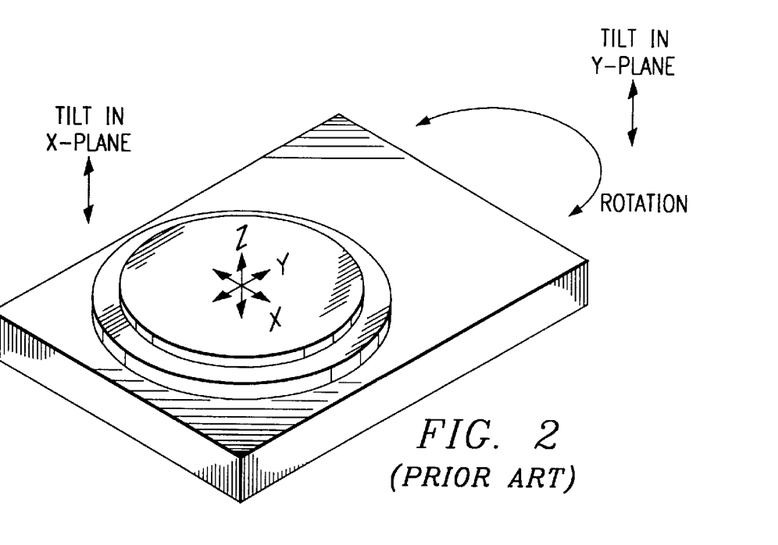
FIG. 2 is an illustration of the possible movements of the stage of a photolithography tool.

Photolithographic tools include a stage that is capable of highly accurate and precise positioning so that the wafer surface is in position to receive a focused projected image. In addition to movement up, down, and side-to-side, a stage must also tilt when necessary to image a desired feature. FIG. 1 shows a prior art stepper or step and scan photolithographic tool. The stage 10, wafer chuck 12, and wafer 14 are moved relative to the reticle 16. Other tool components include the pellicle 18, the lens system 20, and the light source 22. A stepper tool typically exposes the entire reticle onto the wafer at once, whereas a step and scan tool exposes the image by scanning a slit over the surface of the reticle. In either case, the stage must be positioned accurately and precisely for proper exposure of the desired feature in the photoresist. FIG. 2 illustrates the movements of a typical stage.

The photolithographic tool usually achieves focus on the wafer by analyzing an alignment key such as a plus-shaped mark or bulls-eye on the wafer. A typical stage is monitored with laser interferometers with resolution on the order of less than one nanometer as the tool seeks to position the wafer for optimum focus and resolution of the projected image. The degree of translation of the stage along x-, y-, and z-axes for up, down, and side-to-side movements as well as degree of stage tilt as the tool seeks to focus the projected image on the wafer surface are routinely measured and recorded on a die-by-die basis as the image is replicated across the wafer.

Figure 3A:
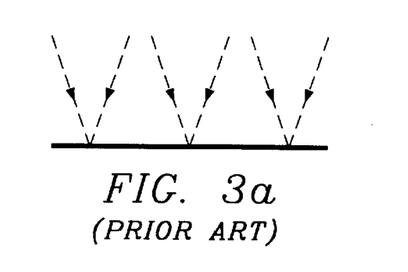
FIG. 3 is a diagram showing the adverse effects on image focus due to imperfections in alignment and in the surface shape of a semiconductor wafer.
Figure 3B:
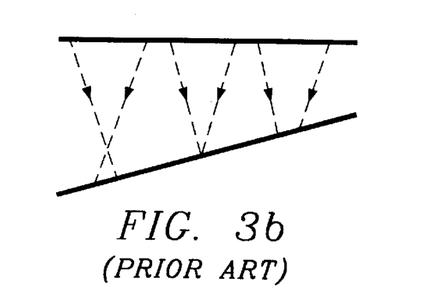
Figures 3C, 3D, 4:
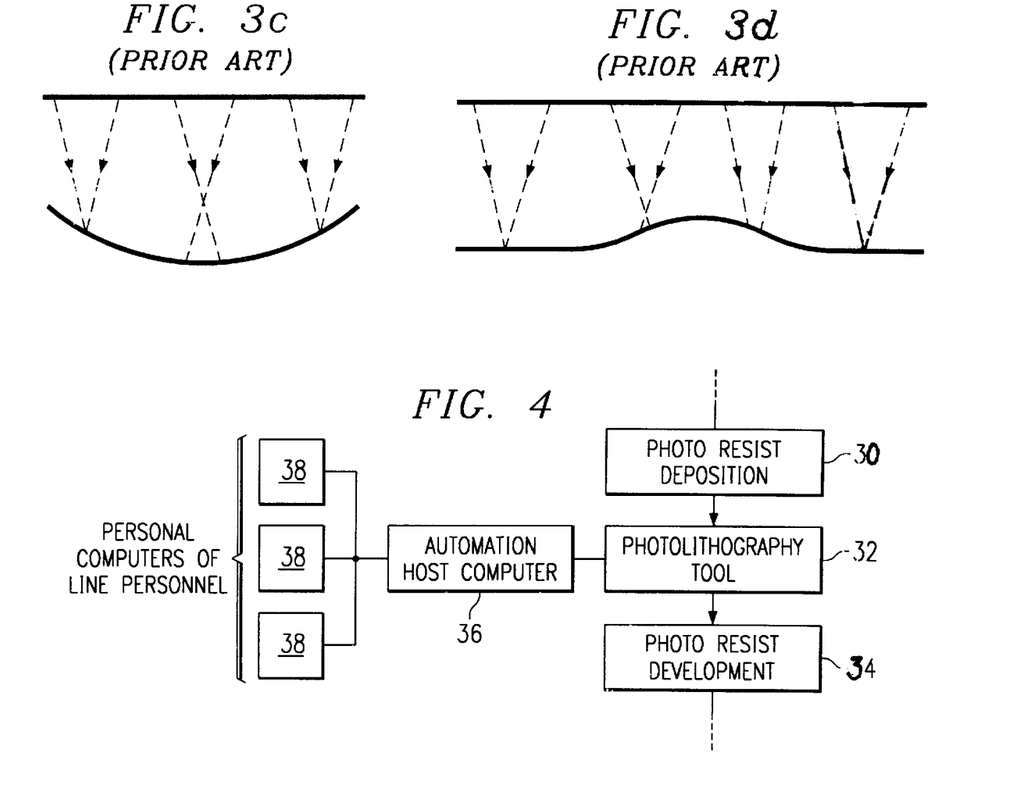
FIG. 4 is a block diagram of a portion of an embodiment system showing the relation of an automation host computer to a photolithography tool and to the computers of relevant line personnel.

FIGS. 3a to 3d are depictions of light impinging upon the photoresist layer on a semiconductor wafer. FIG. 3a is an ideal situation in which the light paths striking the photoresist surface all travel equal lengths. FIG. 3b shows the effects of a wafer surface that is inclined relative to the light source. FIG. 3c shows the effects of warpage of the wafer or perhaps dishing of the photoresist layer. FIG. 3d shows the effects of either a particle on the backside of the wafer or a defect such as a scratch in the photoresist. Note that in the cases of FIGS. 3b, 3c, and 3d, the light paths are not equal, a fact which typically results in poor reproduction of the reticle image in the photoresist. To counteract this, a typical photolithographic tool attempts to tilt the stage relative to the light source as it steps or scans over the inclined or warped surface, or over the undesirable topographical feature, as the case may be.

BRIEF SUMMARY OF THE INVENTION

In one embodiment of the invention, a method is disclosed for reducing the effect of errors in a semiconductor process wherein the process incorporates a photolithography tool in which a stage holding a semiconductor wafer is automatically moved into focus. The method includes the steps of collecting data indicating the movement the photolithographic tool performs to bring the semiconductor wafer into focus; comparing the data with pre-determined error conditions for the movement; and generating a signal to indicate that the data meets the pre-determined error conditions.

In another embodiment of the invention, a method is disclosed for reducing the effect of errors in a semiconductor process wherein the process incorporates a photolithography tool in which a stage holding a semiconductor wafer is tilted during autofocusing in response to a topographical feature on the wafer. The method includes the steps of logging the mean standard deviation of the pitch of the stage for each exposure the tool makes on the wafer; comparing the logged mean standard deviation of the pitch of the stage for each exposure to pre-determined error conditions; and implementing a pre-determined action in the event the logged mean standard deviation of the pitch of the stage meets the pre-determined error conditions.

In still another embodiment of the invention, a photolithography system is disclosed. The system includes a photolithography tool that includes a stage upon which a semiconductor wafer is mounted. The tool is operable to move the stage to automatically focus a pre-determined image on a surface of the semiconductor wafer. The tool is further operable to log movements of the stage. The system also includes an automation host computer operable to poll the photolithography tool to obtain data reflecting the logged movements of the stage. The automation host computer is further operable to analyze the data and compare the data to pre-determined error conditions. The host computer also takes a pre-determined action in the event the data meets the pre-determined error conditions.

An advantage of the invention is that it provides early detection of a chuck or wafer contamination or other process error and thus eliminates costs associated with processing wafers with die that eventually have to be scrapped as a result of poor resolution caused by the processing error. The invention is particularly useful for detecting repetitive errors that can adversely affect multiple lots of wafers and is fast enough to respond to wafer defects before a wafer or lot of wafers moves from the photolithography step to photoresist development.

BRIEF DESCRIPTION OF THE SEVERAL VIEWS OF THE DRAWINGS

FIG. 8 is a plot of mean standard deviation of stage pitch for die numbers one through ten on all of the wafers in a lot in which abnormalities consistent with contamination on the backside of the wafer or mounting chuck are present. FIG. 8 also shows an electronic message that is sent in response to detection of the abnormalities.

DETAILED DESCRIPTION OF THE INVENTION

FIG. 4 is a block diagram of a portion of a semiconductor integrated circuit fabrication process. The initial block 30 represents the equipment used to deposit, spin, and bake the photoresist onto a wafer. It is followed by the photolithography tool 32 and then by the equipment 34 dedicated to photoresist development. An automation host computer 36 is coupled to the photolithography tool and is also coupled to the personal computers 38 of relevant line management personnel through a local area network, for example.

In one embodiment of the invention, data recording the movement of the stage as the tool 32 seeks to maintain focus as it steps or scans are used to detect die-to-die, wafer-to-wafer, and lot-to-lot defects or errors that have an adverse effect on yield. The automation host computer 36, which controls the tool, reacts to detection of such problems by generating an alert signal and by taking an action specified in an action look-up table, for example. The severity of the problem detected through analysis of the stage movement data determines the action taken by the computer 36 to maintain the best yield in the circumstances. Actions that the computer 36 can take include noting the problem in the relevant data log for a particular die, wafer, or lot, and in serious cases, by putting a lot on hold or taking the tool off-line. The system is also enabled to alert line personnel to potentially yield-reducing problems, typically by sending an electronic message to the personal computers 38 of the personnel.

In the preferred embodiment method, stage tilt focus data from a scanning photolithographic tool 32 is used to detect wafer chucking errors (e.g. contamination on either the chuck or the wafer backside) or other problems that result in undesirable topography at the wafer or photoresist surface. The tool 32 logs the mean standard deviation of the stage pitch (hereinafter referred to as the "tilt focus data") as it scans the reticle to image a particular die. An automation host computer 36 polls the scanning tool 32 and pulls this tilt focus data for each die for each wafer. The data are then used in a model designed to detect focus hot-spots on a wafer and within a lot of wafers. Using the model, the host computer 36 determines whether the tilt focus data is within one of several ranges. The host computer then consults an action look-up table and implements the appropriate action, whether it be to alert relevant personnel (e.g. via e-mail), put the lot on hold, or even log the system down entirely if the problem appears to threaten multiple lots of wafers. The host computer 36 can typically perform its analysis of the tilt focus data for a wafer within one minute, a time span short enough to allow for action to be taken to hold or stop a wafer or lot of wafers before the wafer or lot of wafers proceeds to the subsequent processing step, which is typically photoresist development 34.

Figure 5:
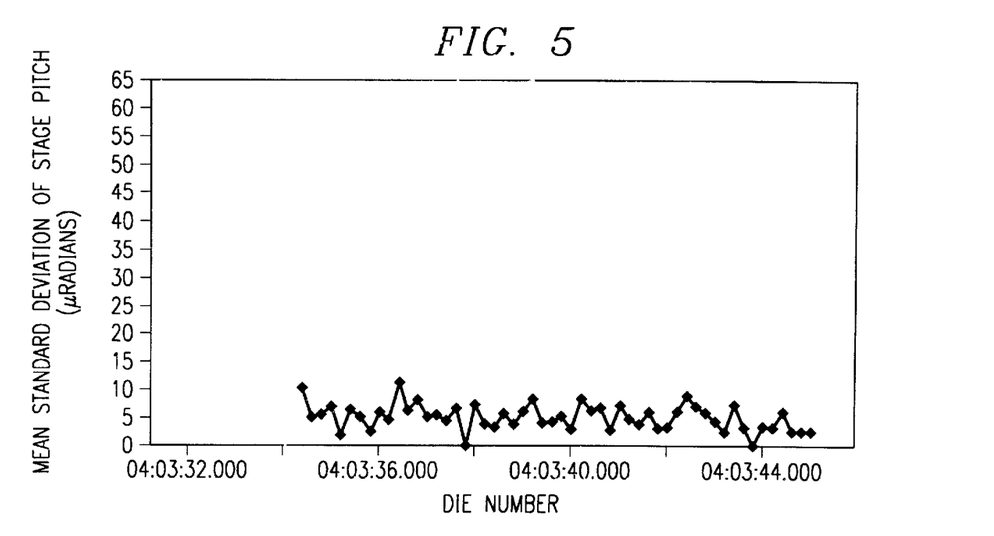
FIG. 5 is a plot of mean standard deviation of stage pitch for the various die on a semiconductor wafer showing no pitch abnormalities or process errors.
Figure 6:
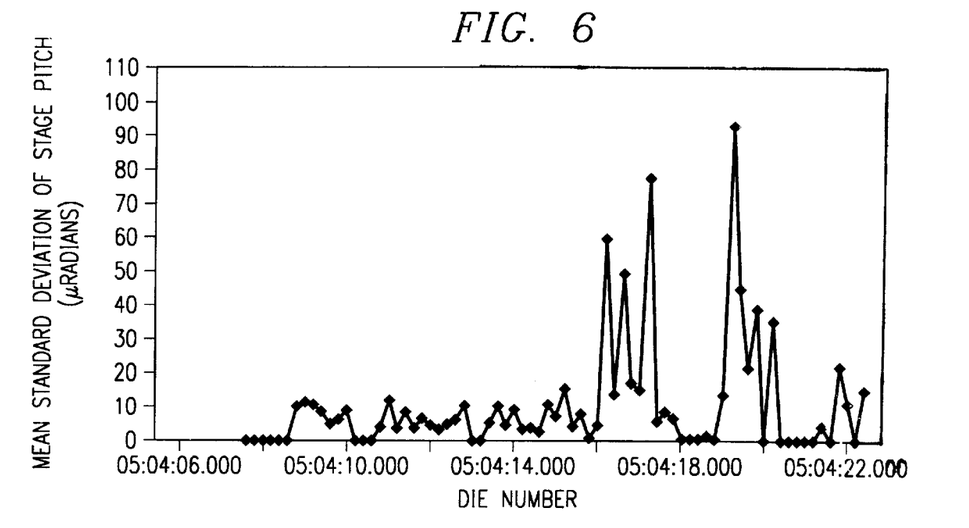
FIG. 6 is a plot of mean standard deviation of stage pitch for the various die on a semiconductor wafer showing abnormalities consistent with contamination on the backside of the wafer or the mounting chuck.
Figure 7:
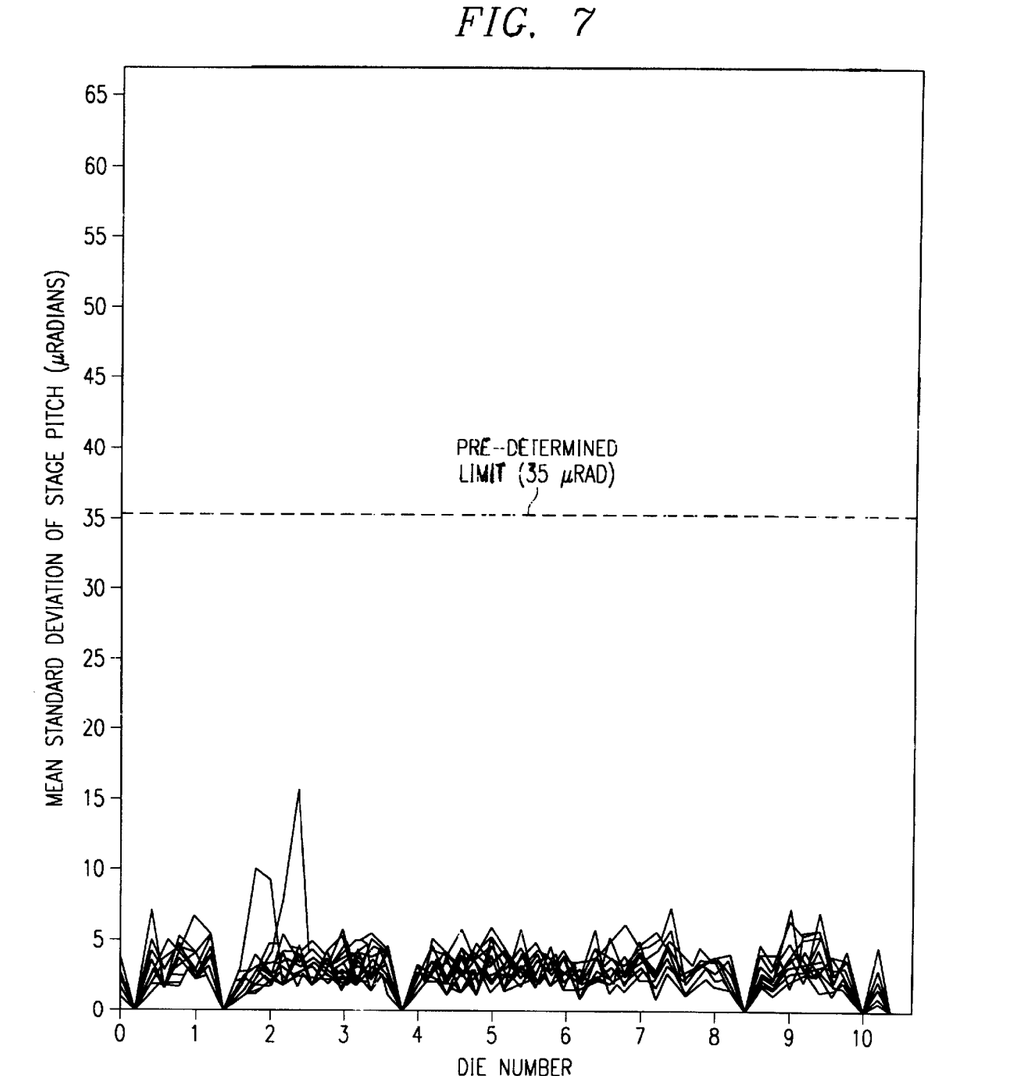
FIG. 7 is a plot of mean standard deviation of stage pitch for die numbers one through ten on all of the wafers in a lot in which no pitch abnormalities or process errors are indicated. The plot also shows the pre-determined error limit.
Figure 8:
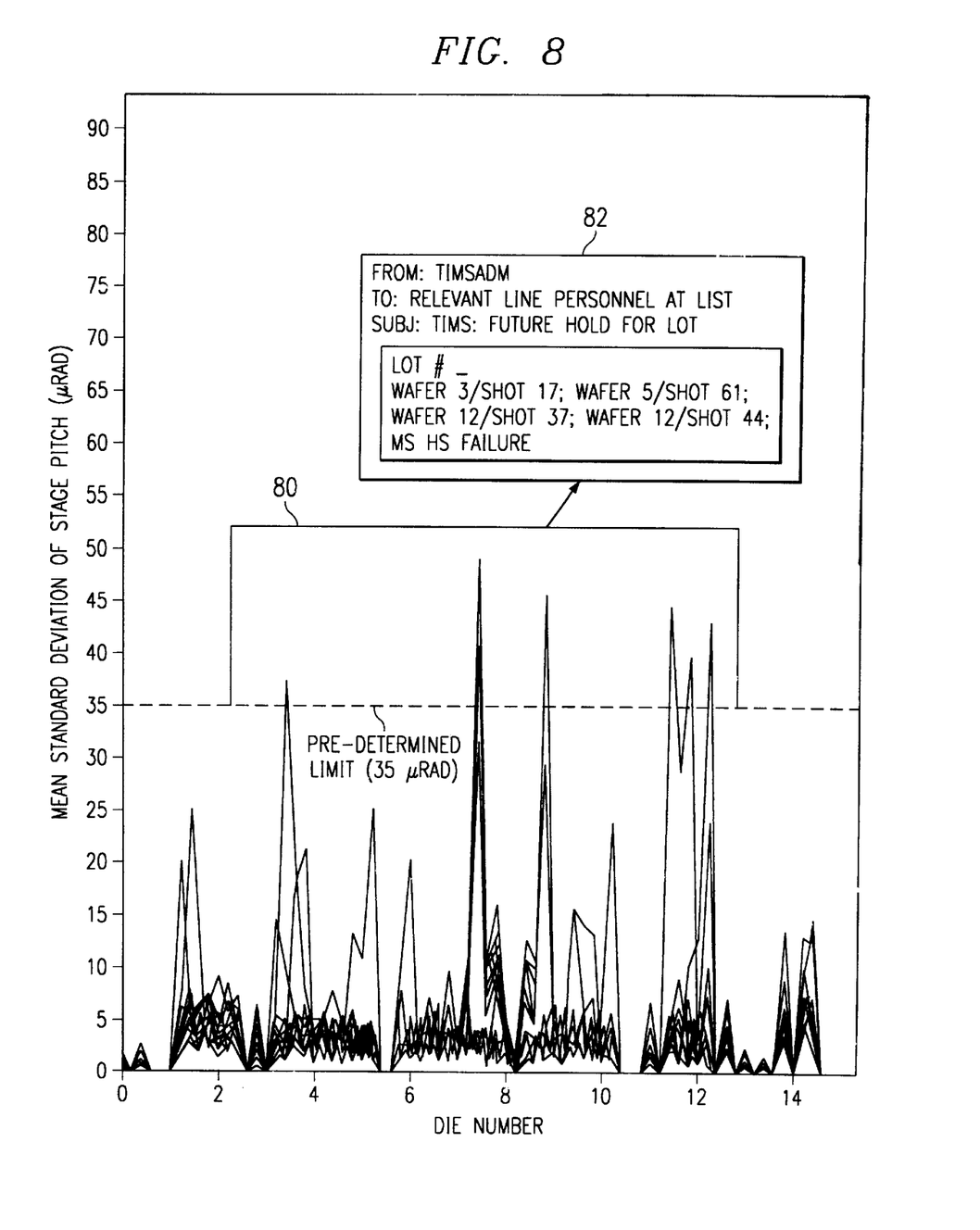

FIG. 5 is a plot of the mean standard deviation of the stage pitch (i.e. the tilt focus data) for each die on a particular wafer. The tilt focus data for the dies on this particular wafer are all less than approximately $10 \times 10^{-6}$ radians. In contrast, the data in FIG. 6 shows several die with a stage pitch having a mean standard deviation that is substantially higher, on the order of $30 \times 10^{-6}$ radians to $90 \times 10^{-6}$ radians, which indicates that the stage attempted to adjust to a non-flat wafer surface topography when scanning those dies. FIG. 7 shows the tilt focus data for dies one through ten for all the wafers in a particular lot. This plot also includes the predetermined limit of $35 \times 10^{-6}$ radians set by process line personnel. All of the dies shown are "good" in that the mean standard deviation of the stage pitch is less than the predetermined limit. In contrast, FIG. 8 shows tilt focus data for a lot containing "bad" dies. In particular, the tilt focus data for die number eight on several wafers exceed the $35 \times 10^{-6}$ radians criteria. Data appearing in the box 80 in FIG. 8 indicates dies likely to suffer from focus abnormalities. In response to the data appearing in the box 80, an electronic mail message 82 is automatically generated by the automation host computer and is sent to the relevant line personnel monitoring the photolithographic step of the wafer fabrication process.

Figure 9:
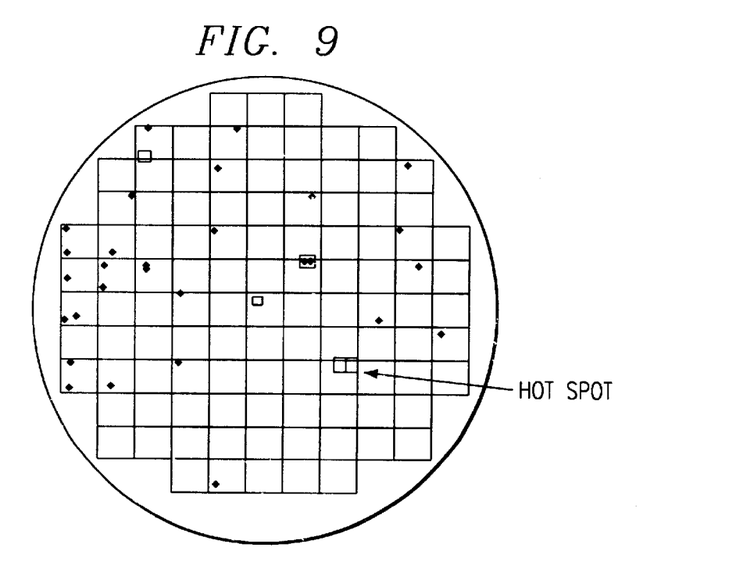
FIG. 9 is an example of a yield enhancement wafer map upon which tilt focus errors and abnormalities are plotted.

FIG. 9 is a yield enhancement wafer map showing how the tilt focus data can be displayed to enable line personnel to easily determine the location of a potential source of the undesirable topography, such as contamination on the backside of the wafer or on the wafer chuck. A repetition of problems in the same location over several wafers may indicate that a particle or other contamination may exist on the chuck. It could also indicate that a step upstream in the process may be leaving residue in a certain pattern on the backside of wafers. Early detection of this type of problem is of course essential to maintaining high yield of the process. In prior art systems, such problems would typically go undetected for an extended period as there was little feedback from the process to assist in identifying the source and location of focus errors.

Figure 10A:
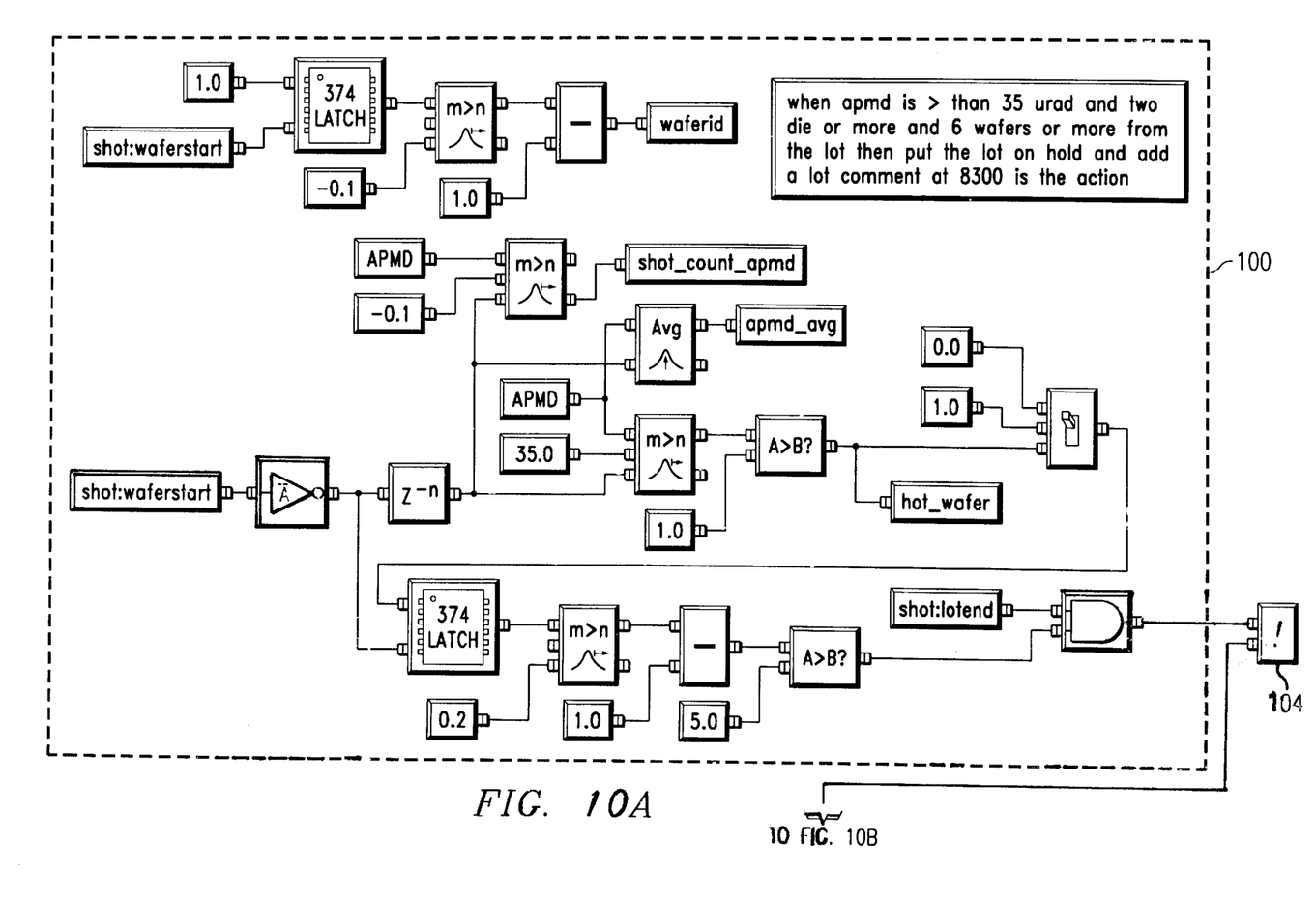
FIG. 10 is a schematic diagram of a model used by an automation host computer to analyze tilt focus data and take appropriate actions when abnormalities or irregularities appear in that data.
Figure 10B:
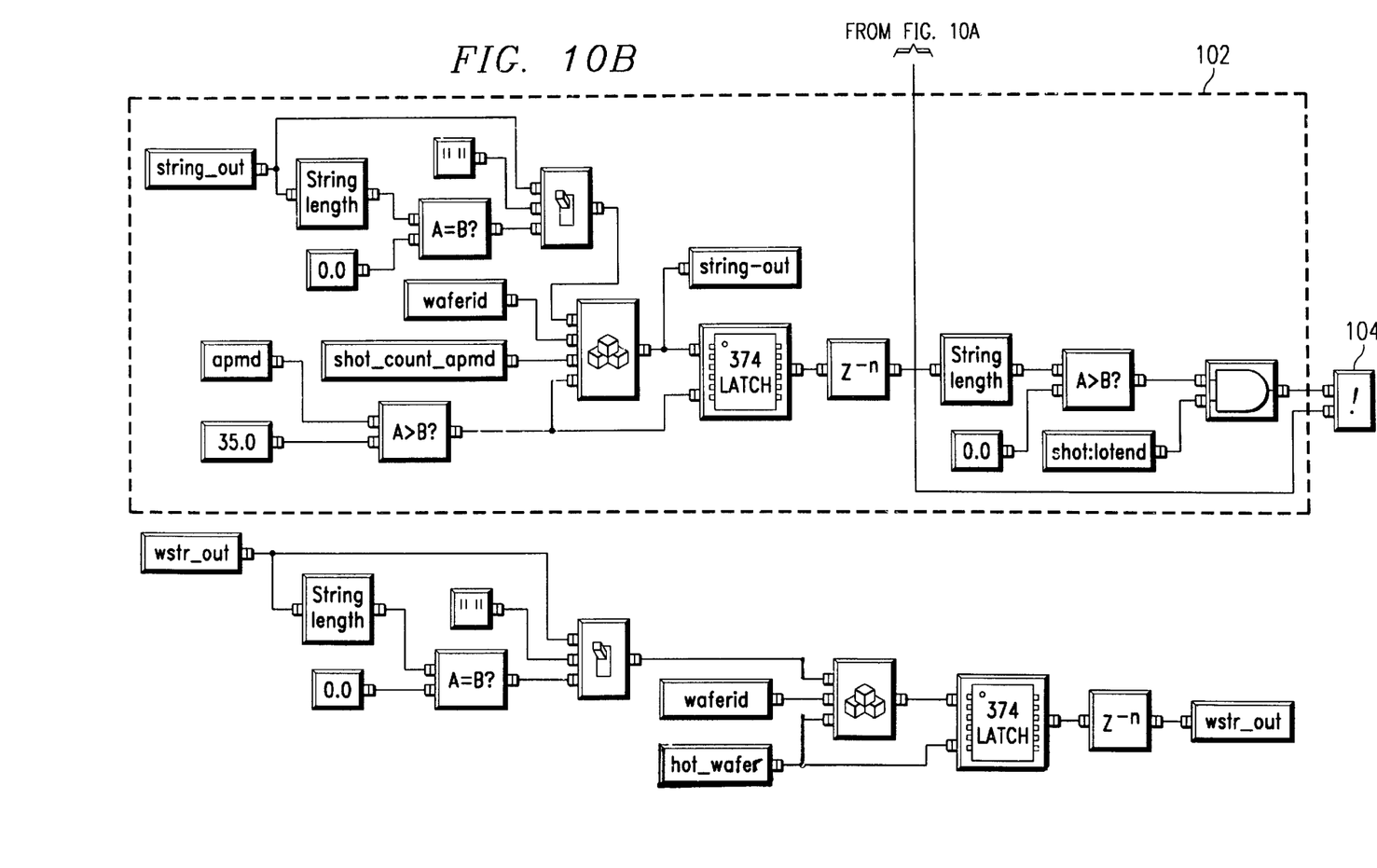

FIG. 10 is a logic diagram of the model that is implemented on a tool interdiction modeling system to allow the automation host computer 36 (in FIG. 4) in the system to take appropriate action when tilt focus data hotspots are detected. The model includes three parts: a die/wafer counter 100, a string builder 102 to keep track of the die and wafer count in the event of a detected failure; and the action look-up table that determines the actions to be taken in the event of focus data abnormalities. The automation host computer is triggered to access the action look-up table by events 104 in the model.

Figure 11A:
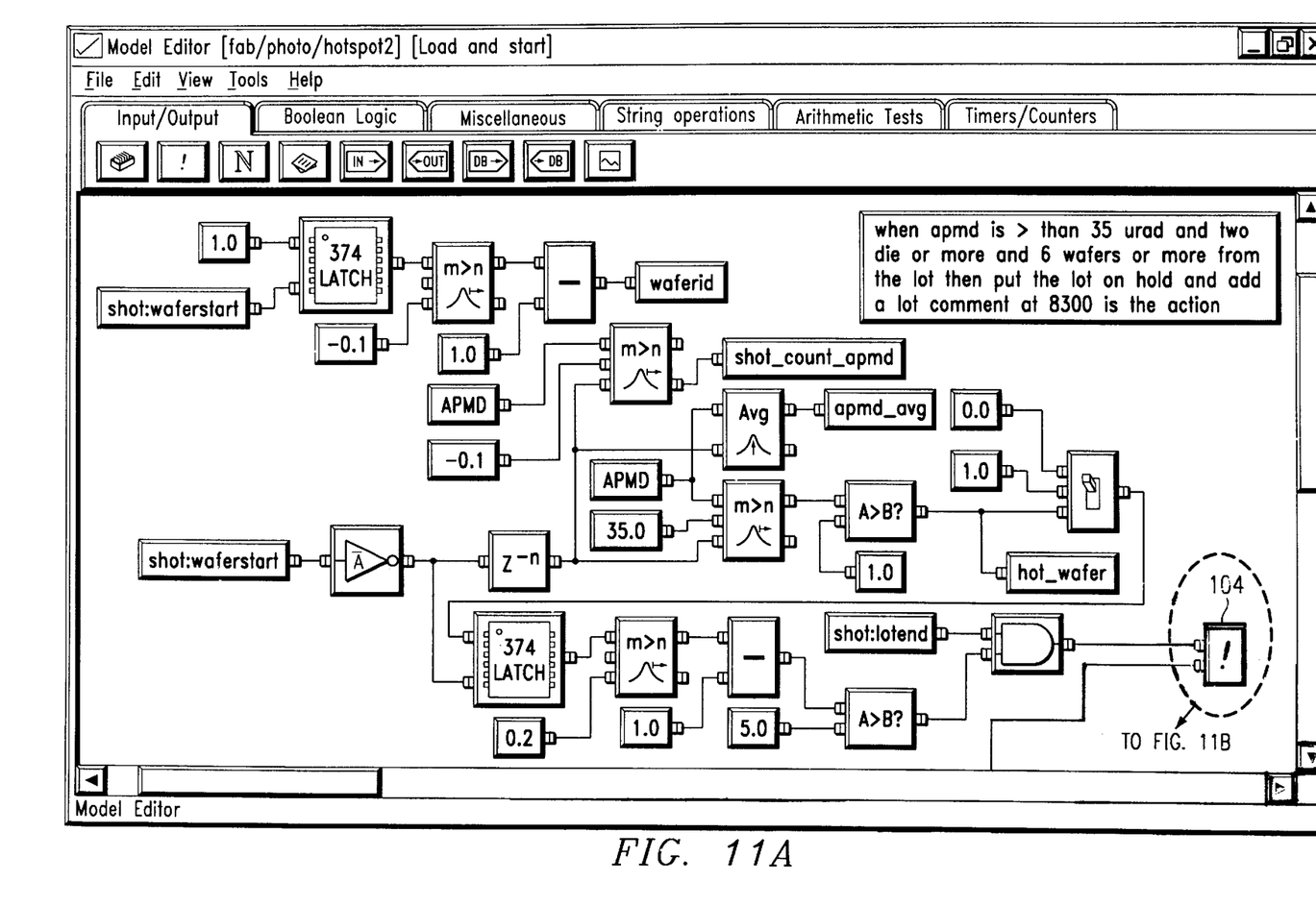
FIG. 11 is a diagram illustrating the actions taken by the automation host computer upon detecting abnormalities in tilt focus data.
Figure 11B:
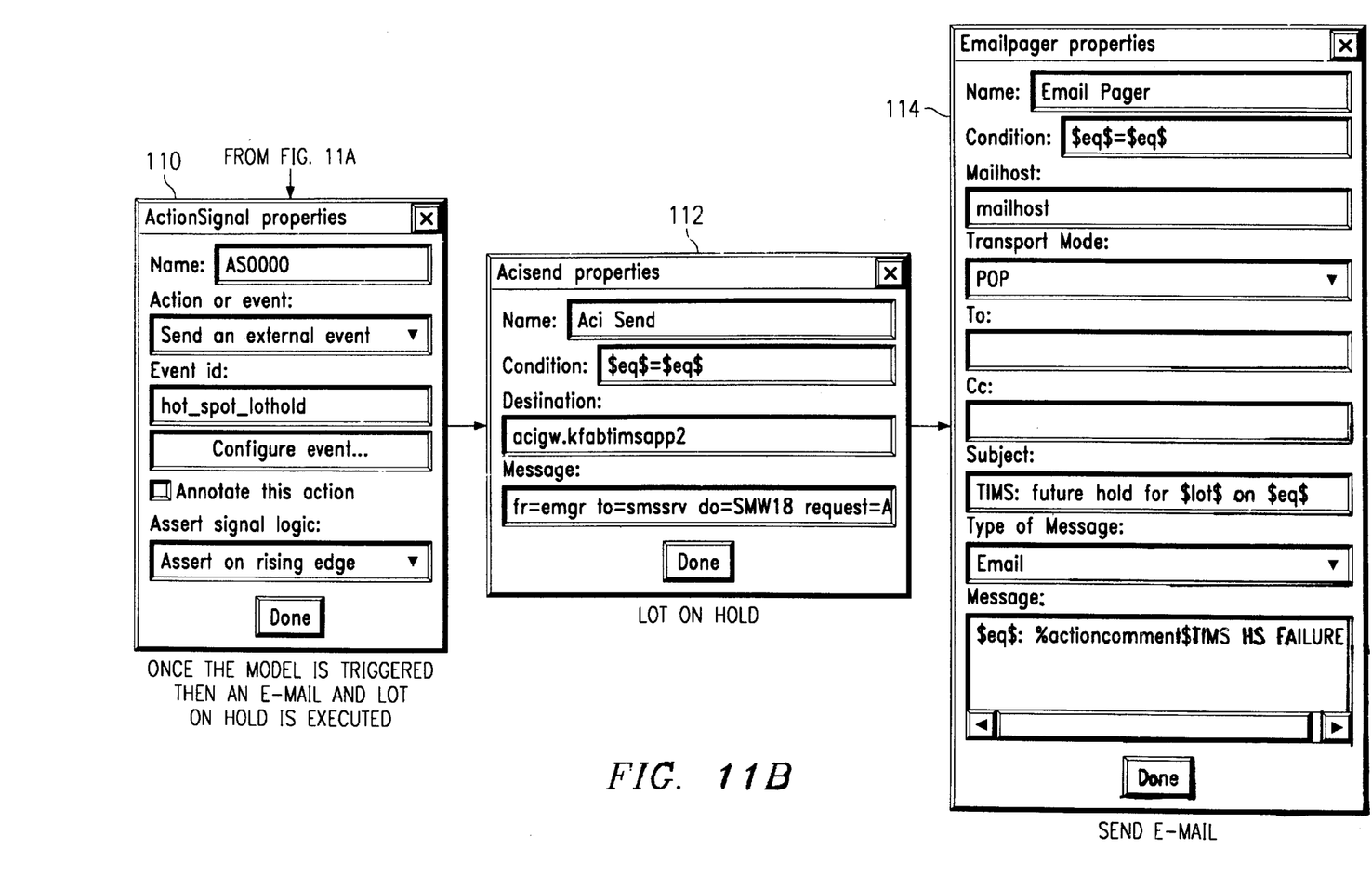

FIG. 11 is an illustration of the steps taken by the automation host computer in response to the triggering event 104. In this embodiment, after consulting the look-up table, the automation host computer elects to put the lot of wafers on hold. This is indicated in signal panel 110 by the event identification "hot_spot_lothold". The automation host computer then sends the lot-on-hold signal 112, followed by an electronic mail message 114 to relevant line personnel notifying them of the focus data abnormalities.

Figure 12:
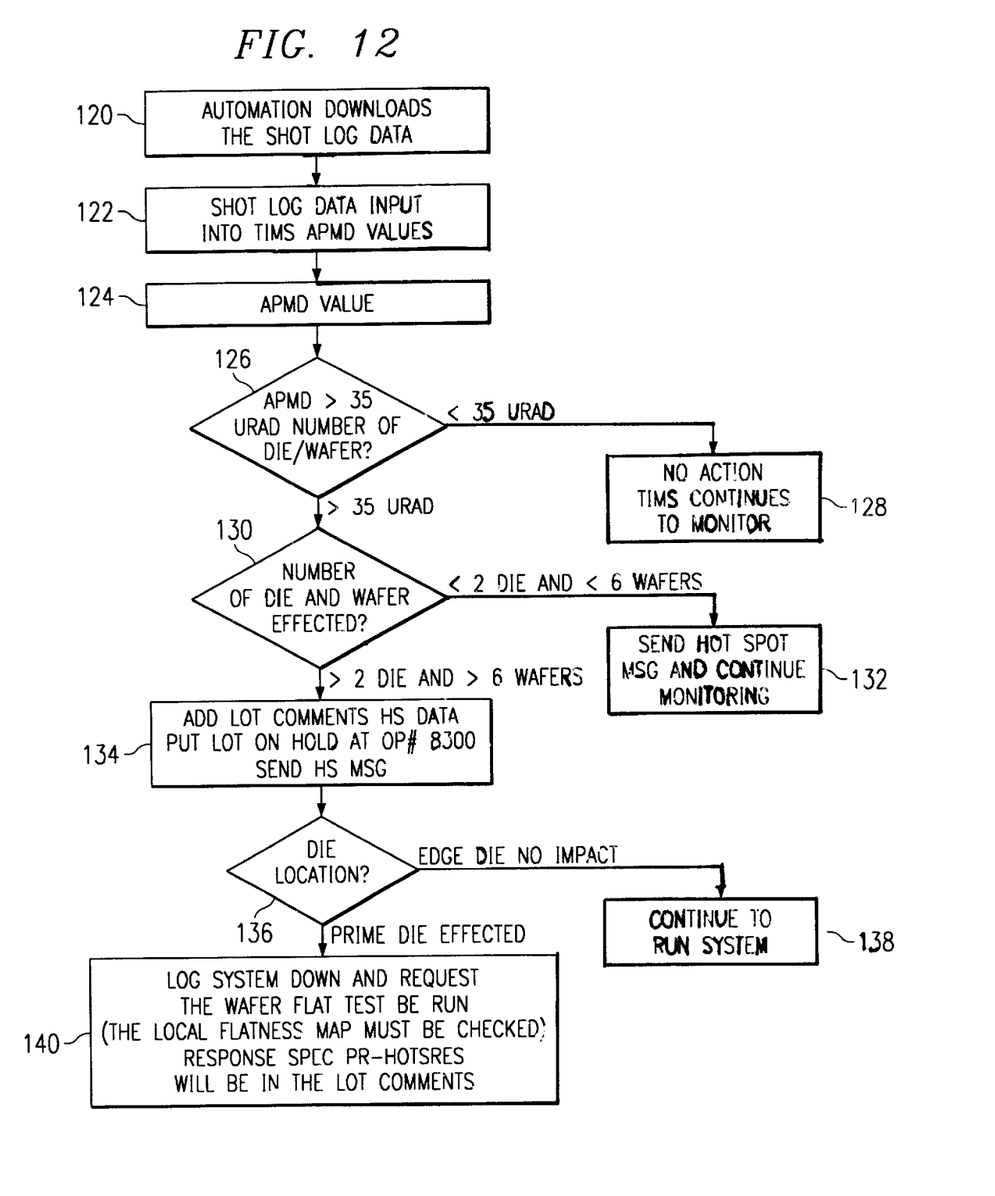
FIG. 12 is a flow chart illustrating the actions taken by the automation host computer in response to abnormalities in tilt focus data for a given number of die and wafers in a lot.

FIG. 12 is a flow chart illustrating the focus monitoring process. The process begins with a step 120 in which the automation host computer polls the photolithographic tool and downloads shot log data from the tool for a wafer lot. This data set includes the mean standard deviation of the stage pitch (i.e. tilt focus data that is referred to in FIG. 12 as "APMD values"). In the next steps, 122 and 124, the shot log data is put into the model and readied for evaluation. In step 126, the model tests whether the tilt focus data for a particular die exceeds a pre-determined threshold, in this case $35 \times 10^{-6}$ radians. If the tilt focus data is all less than $35 \times 10^{-6}$ radians, the computer takes no action (128). However, if any of the data exceeds $35 \times 10^{-6}$ radians, the number of die and wafers containing tilt focus data exceeding that threshold is evaluated (130). In this embodiment, if less than six wafers are affected, an electronic mail message is sent to relevant line personnel notifying them of the abnormal data, but no other action is taken by the computer other than continued monitoring (132). If more than two die on a wafer or more than six wafers in a lot are affected by abnormalities, in step 134, the computer adds a comment in the lot record and then sends a signal to put the lot on hold at a particular step in the process. It also sends an electronic mail message to relevant line personnel notifying them of the action, along with a list of the affected die and wafers. The computer then (136) determines the location of the affected die on the wafer. Die locations toward the center of the wafer and away from the wafer edge are considered "prime die" and problems affecting those die locations are of more concern than problems affecting "edge die". If the computer determines that only edge die are affected (138), it takes no action. However, if prime die are affected (140), the computer logs the system down and signals the need for a test to be run to determine wafer flatness. In addition, an appropriate comment is inserted in the lot record by the computer.

While the present invention has been described according to its preferred embodiments, it is of course contemplated that modifications of, and alternatives to, these embodiments, such modifications and alternatives obtaining the advantages and benefits of this invention, will be apparent to those of ordinary skill in the art having reference to this specification and its drawings. For example, where stage movement data are relied upon in the embodiments described herein, one skilled in the art will appreciate that the movements made by a photolithography tool to achieve focus on a semiconductor wafer could involve movement of the reticle relative to a stationary stage, or alternatively could involve movement of both the reticle and the stage, in which case the movements of the stage relative to the reticle would could be used in the inventive method regardless of which tool component makes the movement. It is contemplated that such modifications and alternatives are within the scope of this invention as subsequently claimed herein.

We claim:

1. A method for reducing the effect of errors in a semiconductor process wherein said process incorporates a photolithography tool in which a stage holding a semiconductor wafer is automatically moved into focus, said method comprising:

collecting data indicating the movement the photolithographic tool performs to bring the semiconductor wafer into focus;

comparing said data with pre-determined error conditions for said movement;

generating a signal to indicate that said data meets said pre-determined error conditions.

2. The method of claim 1, wherein said step of collecting data comprises collecting data at a plurality of locations on said semiconductor wafer, and said step of comparing comprises comparing said data collected at said plurality of locations on said semiconductor wafer with pre-determined error conditions, and said step of generating comprises generating a signal to halt subsequent processing for said wafer if data for a pre-determined number of said plurality of locations exceeds said pre-determined error conditions.

3. The method of claim 1, wherein said step of collecting data comprises polling said photolithography tool for the mean standard deviation of the pitch of the stage.

4. The method of claim 1, wherein said pre-determined error conditions comprise a threshold for the maximum mean standard deviation of the pitch of the stage.

5. The method of claim 1, wherein said signal comprises an electronic mail message to personnel monitoring said process.

6. A method for reducing the effect of errors in a semiconductor process wherein said process incorporates a photolithography tool in which a stage holding a semiconductor wafer is tilted during autofocusing in response to a topographical feature on said wafer, said method comprising:

logging the mean standard deviation of the pitch of said stage for each exposure said tool makes on said wafer;

comparing the logged mean standard deviation of the pitch of said stage for each exposure to pre-determined error conditions;

implementing a pre-determined action in the event the logged mean standard deviation of the pitch of said stage meets said pre-determined error conditions.

7. The method of claim 6, wherein said step of logging is performed by a computer in the photolithography tool.

8. The method of claim 7, where said step of comparing comprises polling of the computer in the photolithography tool by an automation host computer external to said photolithography tool, and further comprises analyzing polled data in a model by said automation host computer.

9. The method of claim 6, wherein said step of implementing a pre-determined action comprises sending an electronic mail message to personnel monitoring said process.

10. The method of claim 6, wherein said step of implementing a pre-determined action comprises suspending an affected wafer or wafers from further processing.

11. The method of claim 6, wherein said step of implementing a pre-determined action comprises taking said photolithography tool off line.

12. A photolithographic method, comprising the steps of:

mounting a semiconductor wafer on a movable stage;

automatically focusing a patterned image on said wafer by moving said stage until focus is achieved;

collecting data indicating the movement of the stage during said focusing step;

comparing said data with pre-determined error conditions for said movement; and generating a signal to indicate that said data meets said pre-determined error conditions.

13. The method of claim 12, wherein said step of collecting data comprises collecting the mean standard deviation of the pitch of the stage.

14. The method of claim 12, wherein said pre-determined error conditions comprise a threshold for the maximum mean standard deviation of the pitch of the stage.

15. The method of claim 12, wherein said step of collecting data comprises collecting data at a plurality of locations on said semiconductor wafer, said step of comparing comprises comparing said data collected at said plurality of locations on said semiconductor wafer with pre-determined error conditions, and said step of generating comprises generating a signal to halt subsequent processing for said wafer if data for a pre-determined number of said plurality of locations exceeds said pre-determined error conditions.

* * * * *